United States Patent [19]

Milberger

[11] 4,425,518

[45] Jan. 10, 1984

[54] HIGH VOLTAGE FIELD EFFECT TRANSISTOR PULSE APPARATUS

[75] Inventor: Walter E. Milberger, Severna Park, Md.

[73] Assignee: The United States of America as represented by the Secretary of the Air Force, Washington, D.C.

[21] Appl. No.: 247,495

[22] Filed: Mar. 25, 1981

[51] Int. Cl.³ .................. H03K 17/687; H03K 3/45
[52] U.S. Cl. ............................. 307/571; 307/260; 307/314
[58] Field of Search .............. 307/260, 252 L, 314, 307/571, 254; 330/297

[56] References Cited

U.S. PATENT DOCUMENTS

| | | | |
|---|---|---|---|
| 3,024,422 | 3/1962 | Jansson | 330/297 |
| 3,267,290 | 8/1966 | Diebold | 307/314 |
| 3,502,910 | 3/1970 | Johanson-Brown | 307/252 L |
| 3,919,668 | 11/1975 | Minami et al. | 307/228 |
| 4,317,055 | 2/1982 | Yoshida et al. | 307/584 |

Primary Examiner—Stanley D. Miller
Assistant Examiner—B. P. Davis
Attorney, Agent, or Firm—Donald J. Singer; William Stepanishen

[57] ABSTRACT

A high voltage field effect transistor pulse apparatus utilizing majority carrier power field effect transistor in a series configuration to provide a high speed, high voltage output pulse. A fast non-saturating transformer trigger circuit provides a sharp rise time trigger pulse to initiate the high voltage output pulse, while a turn-off circuit provides the off-trigger pulse signal.

6 Claims, 6 Drawing Figures

HIGH VOLTAGE FIELD EFFECT TRANSISTOR PULSE APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a high voltage switching circuit, and in particular, to a high voltage field effect transistor pulse apparatus.

It is well known in the prior art that an electric switch is a device which makes, breaks, or changes the course of an electric circuit. Basically, an electric switch consists of two or more contacts mounted on an insulating structure and arranged so that they can be moved into and out of contact with each other by a suitable operating mechanism.

The term switch is usually used to denote only those devices intended to function when the circuit is energized or deenergized under normal operating conditions; as constrasted with circuit breakers, which have as one of their primary functions the interruption of short circuit currents. Although there are hundreds of types of electric switches their application can be broadly classified into two major categories; power and signal.

In a power application, the function of a switch is to energize or deenergize an electric load. On the low end of the power scale, wallswitches are used in homes and offices for turning lights on and off; dial and push button switches control power to electric ranges, washing machines and dishwashers. On the high end of the scale are load-break switches and disconnect switches in power systems at the highest voltage.

For power applications, when closed, switches are required to carry a certain amount of continuous current without overheating, and in the open position they must provide enough insulation to isolate the circuit electrically. The latter function is particularly important in high voltage circuits because it is the practice in the electrical industry to forbid people from working on electrical equipment unless it is isolated from the electrical supply system by a visible break in air. The present invention provides a means of connecting a high voltage source to a load.

SUMMARY OF THE INVENTION

The present invention utilizes a plurality of field effect transistors which are arranged in a series configuration to provide fast risetime high voltage pulses. The high voltage field effect transistor pulse apparatus provides high voltage pulses in the range of D.C. to several megahertz with turn on times or rise times of less than 25 nanoseconds from the time of the turn-on command. High speed gating circuits are utilized to provide pulsewidth control from less than 20 nanoseconds to D.C.

It is one object of the present invention, therefore, to provide an improved high voltage field effect transistor pulse apparatus.

It is another object of the invention to provide an improved high voltage field effect transistor pulse apparatus with a transmit delay of less than 25 nanoseconds following the turn-on command.

It is another object of the invention to provide an improved high voltage field effect transistor pulse apparatus with pulsewidth control from less than 20 nanoseconds to D.C.

It is still another object of the invention to provide an improved high voltage field effect transistor pulse apparatus capable of operating from D.C. to several megahertz.

It is yet another object of the invention to provide an improved high voltage field effect transistor pulse apparatus with pulse voltages up to several kilovolts at several amperes.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
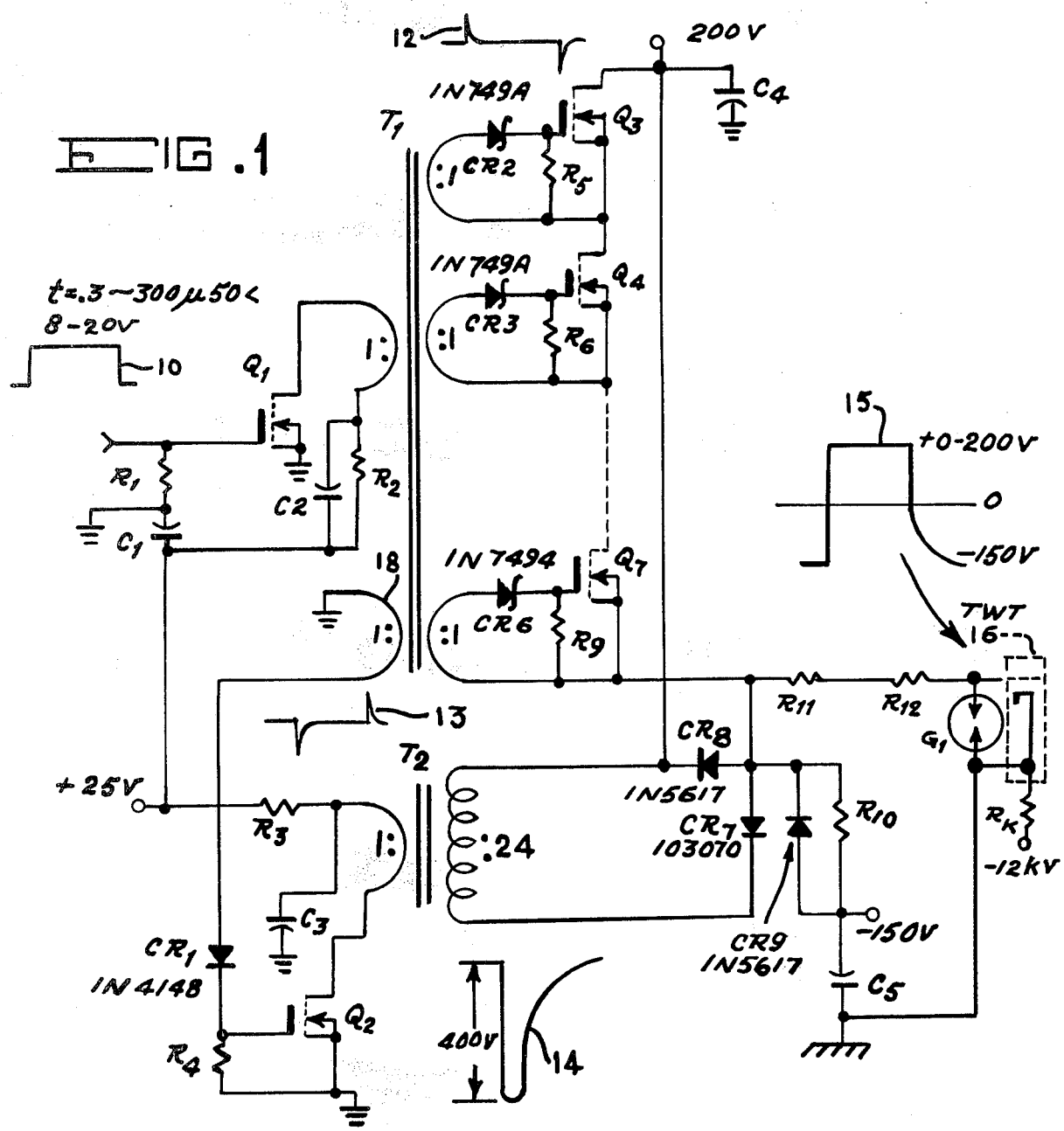
FIG. 1 is a high speed field effect transistor pulse apparatus according to the present invention.

Referring now to FIG. 1, there is shown a schematic diagram of a high speed field effect transistor pulse apparatus utilizing a trigger pulse 10 to initiate the pulse generation process. The trigger pulse 10 may have a pulse amplitude in the range of 8 to 20 volts and a pulsewidth in the range of 0.3 sec to 300 microseconds. The trigger pulse 10 is applied to the gate lead of field effect transistor, Q1. The drain lead of field effect transistor Q1 is connected to an input primary of transformer, T1. Field effect transistors Q3–Q7 are connected respectively to the secondary windings of transformer T1 which has a one to one turns ratio between the primary side of the transformer and the secondary side. A high voltage gating means is connected to the secondary winding of the transformer T1. The high voltage gating means comprises, in the present example, a plurality of field effect transistors Q3–Q7. The field effect transistors Q3–Q7 receive the trigger signal 12 from the secondary of transformer T1 in parallel and simultaneously. The field effect transistors Q3–Q7 are connected in series between the +200 volt power source and the grid of traveling wave tube 16. The grid circuit of traveling wave tube 16 includes a pair of resistors R11, R12 to limit the current flowing into the grid. The cathode of the traveling wave tube 16 has a resistor $R_k$ which is connected to a −12K volt power source.

A pull down circuit is formed by field effect transistor Q2, a one to one ratio transformer tap-off 18 on transformer T1, transformer T2 and its associated circuitry. A trigger signal is supplied by top-off coil 18 on transformer T1 to the gate of field effect transistor Q2. The drain of transistor Q2 is connected to one side of the primary coil of transformer T2, the other side of which is returned to +25 volts. Transformer T2 has a primary to secondary turns ratio of one to twenty-four. The trigger pulse in the primary side of transformer T2 is shown by waveform 13. The output pulse in the secondary side of transformer T2 is shown by waveform 14. The output waveform 14 may be seen to be approximately 400 volts peak to peak.

The secondary winding of transformer T2 is connected by diodes CR7, CR8 to the grid circuit of traveling wave tube 16 which includes resistors R11, R12. The junction of diodes CR7, CR8 is connected to one end of the parallel combination of diode CR9 and resistor R10. The other end of the parallel combination is connected to −150 volts and through a capacitor C5 to earth ground. One end of the spark gap G1 is also returned to the earth ground at capacitor C5. By means of the circuit comprising diode CR9 and resistor R10, the −150 volts is applied to the grid of the traveling wave tube 16 during the off time of the pulser operation.

The high speed field effect transistor pulse apparatus operates in the following manner. For a special purpose application such as the turning on of a high powered transmitter in an ECM system, the pulse apparatus would receive a gate signal pulse 10. The gate signal pulse 10 initiates circuit action by applying a drive signal to the gate of transistor Q1 which causes the drain of that device to swing negative. The transformer T1 is designed to saturate after the first 50 nanoseconds of the programmed gate duration. Thereafter, resistor, R2, sustains the current through the transformer T1 to provide a reset pulse following the trailing edge of the programmed gate. This action thus generates the on-off trigger signal 12 that is applied to the gates of transistors Q3–Q7 by means of coupling zeners CR2–CR6. The saturated pulse transformer usage has the advantage over either non-saturating transformers or isolated on-off trigger schemes in that no crosstalk is experienced since there is no back-swing following the on-off signal.

Figure 2A:
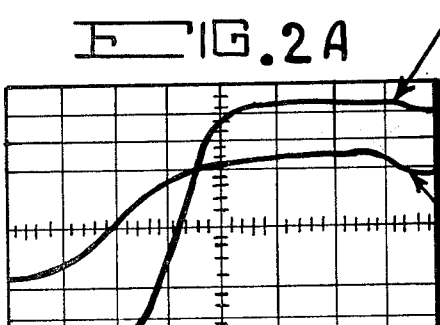
FIGS. 2A and 2B are a graphical representation of the input and output waveforms utilized in the present invention.
Figure 2B:
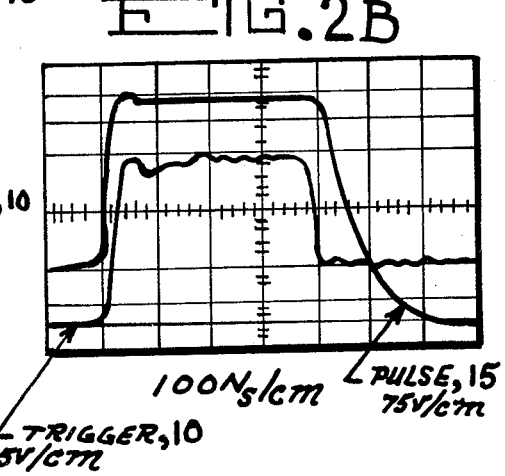

The transformer T1 also provides an off trigger signal 13 to the gate of transistor Q2 to form a discharge pulse to the floating deck via transformer T2. The application of ON trigger signal 12 causes congruent conduction of transistors Q3–Q7. There is shown in FIG. 2A the turn-on characteristics of output waveform 15 with respect to gate control signal 10. The amplitude scale for the trigger signal 10 is 5 volts/cm and the amplitude scale for the output signal 15 is 75 volts/cm. The graphical representation illustrates a voltage swing of 350 volts when the pulse apparatus is operated into a capacitance load of 50 pf at an intercept current of 200 ma. The 25 volt ON trigger overdrives the field effect transistor gates to overcome the drain-to-gate Miller degneration, after which time the gate-to-source capacitances are charged up to the voltage that is established by the input zeners. At the termination of the input control gate signal 10, the 25 volt negative trigger of waveform 12 exceeds the input zener voltage to discharge the gate-to-source capacitance back to cut-off. There is shown in FIG. 2B that pulse stretching due to transistor storage which is customary with bi-polar transistors, is not present in field effect transistor devices. Thus, it may be understood why the field effect transistor devices can be operated in cascode. The circuit has the additional advantage that after the short 50 nanosecond, 25 volt, ON trigger ends, the gate bias drops to a ten-volt level at which point constant current ($I_D - D_{DS}$) characteristics are assumed. This is particularly important for short-circuit operation. In the case of saturation bi-polar transistor operation, this mode can rarely be attained because of the excessive overdrive required to minimize turn-on delay and rise time.

The discharge of the pulser traveling wave tube load capacitance is provided from the ground deck pulser rather than using active devices on the floating deck. At the termination of control gate signal 10, the trigger signal 13 drives the gate of transistor Q2 on. The output 25 volt pulsewidth of transistor Q2 is set by the input gate capacitance and resistor R4. The diode CR1 prevents discharge of the gate R-C circuit. The transformer T2 steps up the drain voltage in excess of 400 volts at its secondary floating deck reference. One end of the secondary of transformer T2 is returned to the floating deck +reference while its complement end is diode gated to the traveling wave tube grid circuit. A negative −150 volt sink supply is required to clamp the 400-volt pulse 14 to that bias level. The discharge pulse 14 may be used to supplement or replace the floating deck −B supply if a sink source is provided. The diodes CR8 and CR9 are used to clamp transients which may appear on output pulse 15. The diode CR9 clamps the pulse waveform 14 to −150 volts while the diode CR8 clamps positive signal overshoots to the plus bias level. The prime function of these diodes CR8, CR9 however, is to protect the pulser apparatus from transients which may be generated by grid arcs in the traveling wave tube. The diodes CR8, CR9 function during the period preceding the ionization of the spark gap G1. The drop-out voltage of the gap G1 must exceed both ± bias voltages in order to prevent the gap G1 from firing after the traveling wave tube grid arc is extinguished. The resistors R11 and R12 operate to limit the current to the diode clamps while the resistor $R_K$ limits the traveling wave tube cathode current.

The coupling transformers T1 and T2 which have toroid cores are unique in pulser design because of their simplicity. The toroid cores which are only large enough to accept a single turn of either 15 to 30 KV silicon wire, are required to provide voltage isolation and magnetic coupling. The type and length of the silicon wire loop is contingent upon the hold-off and creepage distance required for the floating deck voltage. Where the secondary fanning distribution exceeds 600 volts, an additional toroid must be placed either in series or parallel with the ground deck drive source for each 600 volt increment whenever teflon hook-up wire is used.

Figure 3:
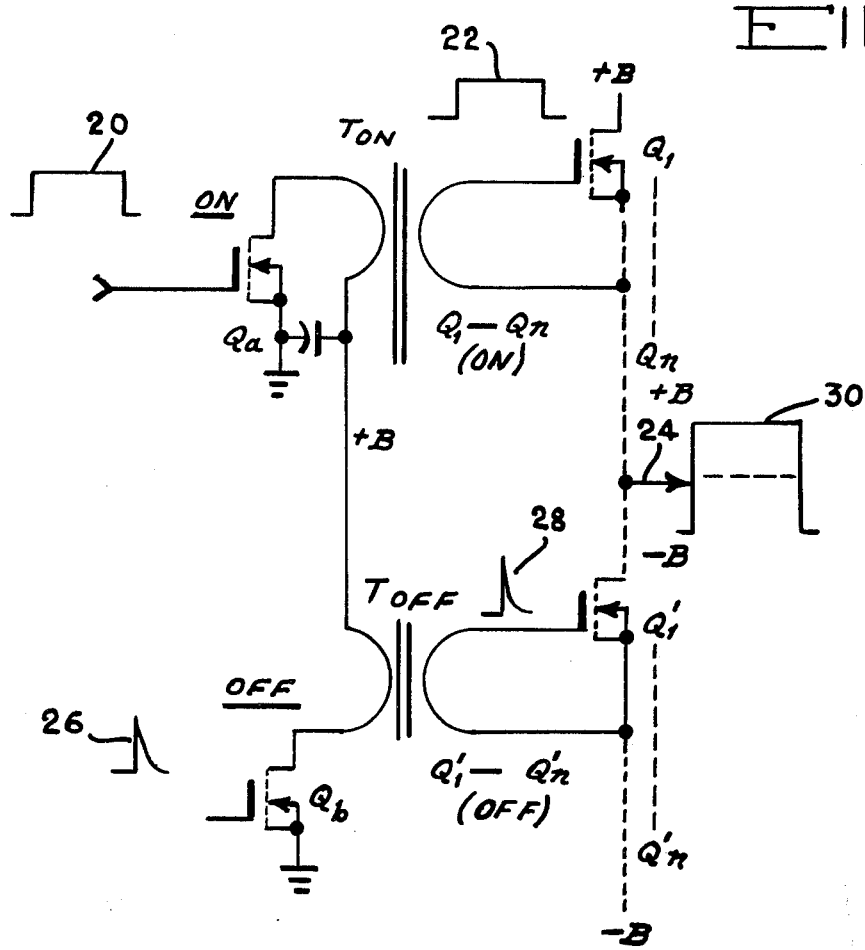
FIG. 3 is a schematic diagram of a video gate circuit utilizing the high speed field effect transistor pulse apparatus; and, FIGS. 4A and 4B are schematic diagrams of on/off trigger switches to provide floating deck switch controls.

Referring now to FIG. 3, there is shown a video gate pulse apparatus utilizing a pair of transformers, $T_{on}$, $T_{off}$ to operate the series transistor strings Q1–Qn and Q'1–Q'n, respectively. An input signal 20 is applied to the gate of transistor $Q_a$ to turn it on. The drain of field effect transistor $Q_a$ is connected to one side of the primary coil of transformer, $T_{on}$. The other side of transformer, $T_{on}$ is connected to a +B power source. The transformer, $T_{on}$ has a turns ratio of one to one from the primary coil winding to the secondary coil winding. The output signal 22 from transformer $T_{on}$ is applied respectively to the gates of field effect transistors Q1–Qn, where n is any positive integer. Although on transistor Q1 is shown, it is to be understood that transistors Q1–Qn comprise a series transistor circuit from the +B power source to the output point 24.

An input signal 26 is applied to the gate of field effect transistor $Q_b$ to turn it on. The source of transistor $Q_b$ is connected to ground, while the drain of transistor $Q_b$ is connected through the primary coil winding of transformer $T_{off}$ to the +B power source. The transformer, $T_{off}$ has a turns ratio of one to one from the primary coil winding to the secondary coil winding. Although only one secondary coil winding is shown, it should be well understood that transformer, $T_{off}$, comprises a plurality of single winding secondaries while are respectively connected to the gates of field effect transistors $Q'1-Q'n$. It should also be well understood that field effect transistors $Q'1-Q'n$ comprises a series transistor circuit from the −B power source to the output point 24. Thus, it may be seen that the input signal 26 appear in the secondary of transformer $T_{off}$ as pulse signal 28. The pulse signal 28 is respectively applied to the gates of field effect transistors $Q'1-Q'n$ which drives the output pulse 30 from the +B level to the −B level. It should be noted that the occurrence of input pulse 26 is in alignment with the fall time of input signal 20.

Figure 4B:
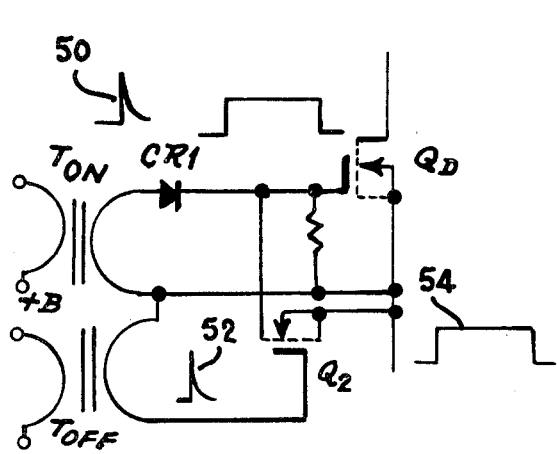
Figure 4A:
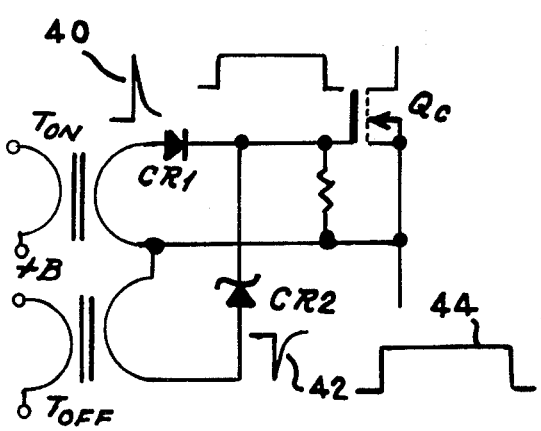

There is shown in FIGS. 4A, 4B alternative embodiments of an on-off trigger switch circuit utilizing a field effect transistor to provide a high voltage pulse output signal. In both FIGS. 4A, 4B separate on and off transformers are utilized to provide the floating deck switch control. It may be seen in FIG. 4A that the secondary windings of transformers $T_{on}$, $T_{off}$ are connected by means of diodes CR1, CR2 to the gate of field effect transistor Q1. Both transformers $T_{on}$, $T_{off}$ have a single winding primary and a single winding secondary with a one to one turns ratio therebetween. On-trigger 40 is applied through diode CR1 to the gate of field effect transistor $Q_c$, thereby initiating the output pulse 44. The negative trigger signal 42 is applied through zener diode CR2 to discharge the gate capacitance of field effect transistor $Q_c$, thereby turning output pulse 44 off.

In FIG. 4B, there is shown an on-off trigger switch apparatus utilizing as shown before separate on-off transformers to provide the on trigger signal and the off trigger signal. The on-trigger pulse 50 is applied through diode CR1 to the gate of field effect transistor, $Q_d$. The off-trigger pulse is applied to the gate of field effect transistor Q2 which is utilized to perform the gate discharge function. The output of the on-off trigger switch apparatus is output pulse 54.

The on-off trigger switch circuits shown in FIGS. 4A and 4B may be substituted in place of the Q1 and Q2 "ON" FET switches of FIG. 3 to implement pulser operation from a continuous "ON" mode (D.C.) to repetition rates up to several megahertz. The DC mode is established by repeating the ON-triggers (40) or (50) in FIGS. 4A and 4B respectively at a rate sufficient to maintain the gate to source voltage of the Qc or Qd FETs at an amplitude that will sustain transistor conduction. This rate is derived from the gate to source input capacitance and resistance. With an input capacitance of 1,000 pf and a gate to source resistance of five megahoms a time constant of five milliseconds is established. Thus, repetitive on triggers at a rate in excess of 200 hertzs is required to sustain "ON" FET conduction. The "OFF" trigger is applied to terminate conduction when other than D-C operation is required.

Other than the switch control of microwave tubes described in this embodiment, the high voltage FET switch techniques can also be applied as high voltage pulsewidth regulator and chopper converter circuits at variable rates up to several MHz. It will be understood to those skilled in the art of the invention is capable of a variety of alternative embodiments within the spirit and scope of the appended claims.

What is claimed is:

1. A high voltage field effect transistor pulse apparatus comprising in combination a pulse forming means to receive an input pulse signal, said pulse forming means providing a trigger pulse in response to said input trigger signal, a first coupling means connected to said pulse forming means to receive said trigger pulse, a first gating means connected to said first coupling means to receive said trigger pulse, said first gating means being operatively connected to a high voltage, said first gating means being responsive to said trigger pulse to provide a high voltage output pulse with a rise time of less than 25 nanoseconds, said first gating means comprising a plurality of field effect transistors in series, and, a pull down means that is inversely coupled to said first coupling means to receive a control pulse therefrom, said pull down means comprising:

a second gating means to receive said control pulse, said second gating means being responsive to said control pulse and providing an off trigger signal, a second coupling means to receive said off trigger signal, said second coupling means having a predetermined coupling ratio, said second coupling means stepping up said off trigger signal to a higher value, said second coupling means including limiting means to limit said off trigger signal to a predetermined voltage, said off trigger signal being applied to said first gating means to terminate said high voltage output pulse.

2. A high voltage field effect transistor pulse apparatus as described in claim 1 wherein said first coupling means comprises a transformer with a one to one turns ratio.

3. A high voltage field effect transistor pulse apparatus as described in claim 1 wherein said first coupling means includes a saturating core.

4. A high voltage field effect transistor pulse apparatus as described in claim 1 wherein said predetermined coupling ratio is one to twenty-four.

5. A high voltage field effect transistor pulse apparatus as described in claim 1 wherein said predetermined voltage is minus four hundred volts.

6. A high voltage field effect transistor pulse apparatus as described in claim 1 wherein said tranformer comprises a single turn conductor in both said primary and secondary.

* * * * *